United States Patent [19]

Grüning

[11] Patent Number: 5,345,096
[45] Date of Patent: Sep. 6, 1994

[54] TURN-OFF HIGH-POWER SEMICONDUCTOR COMPONENT WITH LOW INDUCTIVE HOUSING

[75] Inventor: Horst Grüning, Wettingen, Switzerland

[73] Assignee: ABB Research Ltd., Zurich, Switzerland

[21] Appl. No.: 99,310

[22] Filed: Jul. 30, 1993

[30] Foreign Application Priority Data

Aug. 15, 1992 [DE] Fed. Rep. of Germany ....... 4227063

[51] Int. Cl.⁵ ..................... H01L 23/42; H01L 23/44; H01L 29/74
[52] U.S. Cl. .................................. 257/182; 257/150; 257/688; 257/698
[58] Field of Search ............... 257/181, 182, 150, 151, 257/688, 689, 138, 698, 204

[56] References Cited

U.S. PATENT DOCUMENTS

| | | | |
|---|---|---|---|
| 4,516,149 | 5/1985 | Wakuri et al. | 357/71 |
| 4,626,888 | 12/1986 | Nagano et al. | 357/38 |
| 4,673,961 | 6/1987 | Nishizawa et al. | 357/22 |
| 4,712,128 | 12/1987 | Bennett | 257/689 |
| 4,953,004 | 8/1990 | Almenräder et al. | 257/689 |
| 4,956,696 | 9/1990 | Hoppe et al. | 257/182 |
| 5,043,795 | 8/1991 | Takahashi et al. | 257/182 |
| 5,053,854 | 10/1991 | Almenräder et al. | 357/79 |
| 5,121,189 | 6/1992 | Niwayama | 257/688 |

FOREIGN PATENT DOCUMENTS

| | | | |
|---|---|---|---|
| 0159797 | 10/1985 | European Pat. Off. | |
| 0220698 | 5/1987 | European Pat. Off. | |
| 0265833 | 5/1988 | European Pat. Off. | |
| 0287770 | 10/1988 | European Pat. Off. | |
| 0328778 | 8/1989 | European Pat. Off. | |
| 0381849 | 8/1990 | European Pat. Off. | |
| 0428044 | 5/1991 | European Pat. Off. | 257/688 |
| 0489945 | 6/1992 | European Pat. Off. | |
| 2847853 | 7/1979 | Fed. Rep. of Germany | |
| 2810416 | 9/1979 | Fed. Rep. of Germany | |
| 2840400 | 3/1980 | Fed. Rep. of Germany | |
| 3134074 | 5/1982 | Fed. Rep. of Germany | |
| 3143336 | 5/1983 | Fed. Rep. of Germany | |
| 3322593 | 1/1985 | Fed. Rep. of Germany | |
| 3538815 | 5/1986 | Fed. Rep. of Germany | |
| 4011275 | 10/1990 | Fed. Rep. of Germany | |
| 0018140 | 5/1985 | Japan | |
| 0047977 | 8/1986 | Japan | 257/151 |

Primary Examiner—Rolf Hille
Assistant Examiner—David B. Hardy
Attorney, Agent, or Firm—Oblon, Spivak, McClelland, Maier & Neustadt

[57] ABSTRACT

In a turn-off high-power semiconductor component, in particular in the form of a GTO, comprising a disk-shaped semiconductor substrate (2) which is disposed concentrically in an annular insulating housing (10) between a disk-shaped cathode contact (4), to which pressure can be applied, and a disk-shaped anode contact (5), to which pressure can also be applied, and which is contacted on the cathode-contact side by a gate contact (7, 21), the cathode contact (4) being connected to one end of the insulating housing (10) via a first lid (11a) and the anode contact (5) to the other end of the insulating housing (10) via a second lid (11b), an outwardly hermetically sealed component (1) being formed, and the gate contact (7) being capable of being fed with a gate current via a gate lead (8) brought to the outside, a connection to the gate unit is achieved with low mutual inductance with a minimum of alterations compared with conventional components as a result of the gate lead (8) being of rotationally symmetrical design and being disposed concentrically with respect to the cathode contact (4) and of the gate lead (8) being electrically isolated from the cathode contact (4) by a single insulator.

11 Claims, 3 Drawing Sheets

TURN-OFF HIGH-POWER SEMICONDUCTOR COMPONENT WITH LOW INDUCTIVE HOUSING

FIELD OF THE INVENTION

The present invention relates to the field of power electronics. It relates to a turn-off high-power semiconductor component, in particular in the form of a GTO, comprising a disk-shaped semiconductor substrate which is disposed concentrically in an annular insulating housing between a disk-shaped cathode contact, to which pressure can be applied, and a disk-shaped anode contact, to which pressure can also be applied, and which is contacted on the cathode-contact side by a gate contact, the cathode contact being connected to one end of the insulating housing via a first lid and the anode contact to the other end of the insulating housing via a second lid, an outwardly hermetically sealed component being formed, and the gate contact being capable of being fed with a gate current via a gate lead brought to the outside.

Such a component is disclosed, for example, in the publication EP-B1-0 159 797 (FIG. 7).

DISCUSSION OF BACKGROUND

In power electronics, the trend is towards increasingly more powerful and increasingly fast turnoff components in order to be able to convert electrical powers with increasing efficiency, for example in converters or drives. Such components are, for example, the known GTOs, IGBTs or, alternatively, field-controlled thyristors (FCThs) or static induction thyristors (SIThs).

In this connection, particular difficulties are also presented by the drive of GTOs in particular, because in these components, critical states which usually have to be avoided in the prior art by a complex external protective circuit, the so-called "snubbers", may be assumed as a result of inhomogeneous turn-on and turn-off. However, such "snubbers" not only make the circuit more expensive, but also require appreciable space and cause an additional power loss.

Very recently it has therefore been proposed (EP-A1-0 489 945) to reduce the protective-circuit complexity in GTOs by driving the specified components by a specially designed gate unit in a "hard" mode, ie. with very steep and high gate pulses for the turn-on and turn-off. The object of these proposals was to manage, if possible, without modifying the GTO itself and its housing so that the existing, commercially available components, such as are described in the publication mentioned at the outset, can also continue to be used.

Although it has already been possible to achieve appreciable improvements in the use of GTOs in this manner, further advantages can be achieved, in particular, if measures are also permitted in the internal structure of the components themselves. Of importance in this connection is, in particular, the mutual inductance between the GTO and its gate unit, which mutual inductance decisively impedes the "hard" drive and makes complex gate units necessary in the case of unduly high values, such as are caused by conventionally bringing out the gate lead through the insulating housing. To simplify the gate unit and also to reduce its volume and current consumption, a drastic reduction in the mutual inductance between GTO and gate unit from the existing value of about 30 nH to values of $\leq 2$ nH is therefore desirable.

For FCThs, in particular, but also for GTOs, solutions in which the incorporation of the most important components of the gate unit directly in the component housing is envisaged (in this connection see: EP-A1-0 328 778 or EP-A1-0 381 849) have already been proposed for reducing the mutual inductance. Although such an incorporation results in very low connection inductances, it entails not only high development and manufacturing costs but also a number of impediments, such as:

the lack of availability of suitable pulse capacitors which provide the necessary capacitance values and the required reliability even at the high temperatures;

the lack of reliability of the internal contact in the component;

the need to screen the drive circuit as protection against coupling-in from the main circuit; and the need to have to connect, furthermore, a turn-on circuit (possibly in the housing) and a holding circuit for generating a continuous gate current in the ON state in addition to the turn-off circuit if GTOs are used, in which connection there would still hardly be room in the housing for the holding circuit because of the necessary currents.

For the reasons mentioned, a part of the gate unit would still have to be disposed outside the GTO housing in the known solution.

SUMMARY OF THE INVENTION

Accordingly, one object of the invention is to modify a high-power semiconductor component in such a way that a connection can be made to the gate unit with a minimum of alterations compared with conventional components, which connection has the desired low mutual inductance. The gate unit could then be fitted in a known manner with already tried and tested components (MOSFETs and capacitors) and would continue to be as accessible for servicing or the like as before without the known advantages of the "hard" drive having to be abandoned.

The object is achieved in a component of the type mentioned at the outset, wherein (a) the gate lead is of rotationally symmetrical design and is disposed concentrically with respect to the cathode contact; and (b) the gate lead is electrically isolated from the cathode contact by a single insulator.

The essence of the invention is to reduce the loop inductance formed by the geometrical arrangement of the individual components in the gate-cathode circuit by a modified design and arrangement of gate contact and gate lead, in particular, the gate lead being brought closer to the cathode contact. This solution is suitable particularly for GTOs, but also entails advantages for other turn-off high-power semiconductor components such as, for example, FCThs, IGBTs or SIThs.

A first preferred embodiment of the component according to the invention is distinguished by the fact that the gate contact is of annular design and the gate lead is also of annular design and is brought out of the component. This achieves a good and uniform distribution of the gate current accompanied at the same time by a considerable reduction in the loop inductance.

A first further development is one wherein the gate contact surrounds the cathode contact concentrically at a distance, wherein the gate lead is brought out of the component between the cathode contact and the insulating housing, wherein the gate lead connects the gate contact directly to the first lid, and wherein the first lid is electrically insulated from the cathode contact by an interposed insulating ring which concentrically surrounds the cathode contact. This has the particular advantage that insulating housing and cathode contact, and consequently also the clamping technique for the component, of the conventional "press pack" housing can largely be retained and the space present between cathode contact and insulating housing is optimally utilized.

A second further development is one wherein, to provide a gate connection and a cathode connection, a strip conductor is provided which comprises an insulating sheet provided on both sides with metallization, wherein the strip conductor spans the component on the cathode side, the second metallization facing the component, wherein the insulating sheet and the second metallization have been removed from the strip conductor in the region of the cathode contact in such a way that the first metallization is in direct contact with the cathode contact and forms the cathode connection, and wherein the second metallization is electrically connected directly to the first lid and forms the gate connection.

This type of external connection by means of a strip conductor has particularly low inductance and, in conjunction with the internal design of the component, results in a configuration which is particularly suitable for a "hard" drive because of the low total inductance.

According to a second preferred embodiment of the component according to the invention, the date contact is of annular design, the gate lead is also of annular design and is brought out of the component, the gate contact surrounds the cathode contact concentrically at a distance, and the insulating housing is subdivided into an upper housing part and a lower housing part and the gate lead is brought out of the component between the upper and lower housing part. This embodiment has the advantage that the cathode side of the component can remain completely unaltered with reduced loop inductance.

Further embodiments emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
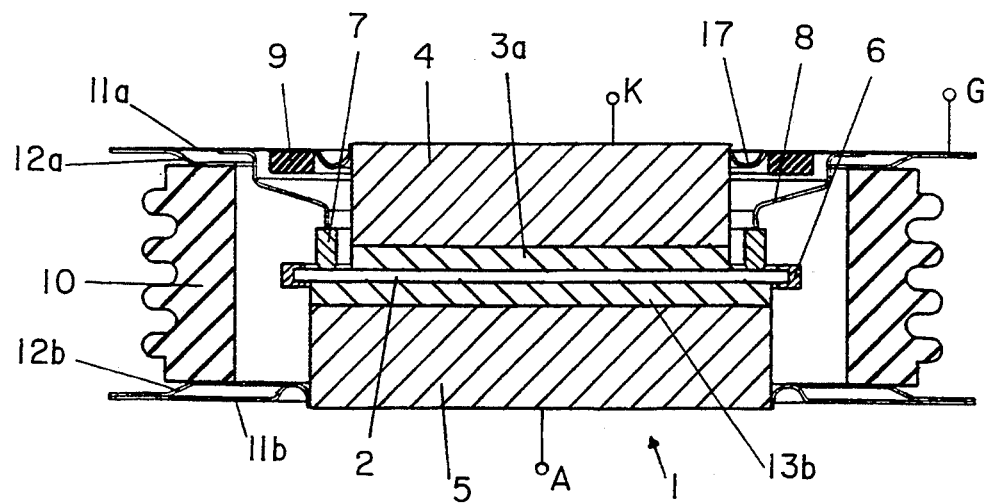
FIG. 1 shows, in section, a first preferred exemplary embodiment for a component in accordance with the invention, comprising an annular gate contact and an annular gate lead brought out between insulating housing and cathode contact.

Referring now to the drawings, wherein like reference numerals designate identical or corresponding parts throughout the several views, FIG. 1 shows, in section, a preferred exemplary embodiment for a component in accordance with the invention. In relation to its housing, the component 1 has many features which are already known from the "press pack" housing which has been introduced into the technology. A central constituent of the component is a stack, to which pressure can be applied from both sides, of various (round) disks, which stack is known in this manner per se.

The stack comprises a semiconductor substrate 2 which is disposed in the center and which is normally manufactured from Si and contains the actual active part of the component (in the case of the GTO, for example, the individual thyristors, the surrounding gate metallization, shorts etc.). To increase the dielectric strength, the semiconductor substrate is provided with an edge passivation 6. The semiconductor substrate 2 is contacted on the cathode side by a disk-shaped cathode contact 4 and on the anode side by a likewise disk-shaped anode contact 5, which are both normally composed of Cu. The cathode connection K is made via the cathode contact 4 and the anode connection A via the anode contact 5. To improve the varying load behavior, Mo disks 3a,b may be provided between semiconductor substrate 2 and the contacts 4 and 5, which disks compensate for the difference in thermal expansion between Si and Cu. In this connection, the semiconductor substrate may be joined to one of the Mo disks 3a,b by a material joint or may be held between the disks by pressure alone (so-called "free-floating silicon" technique or "direct pressure contact").

The stack comprising the disks 2, 3a, 3b, 4 and 5 is concentrically disposed in an annular insulating housing 10 which is preferably composed of a ceramic and is provided with circumferential grooves on the outside to increase the dielectric strength. The insulating housing 10 is provided at both ends with a flange 12a,b in each case which is designed as a sheet-metal ring and is joined to the ceramic of the housing by a metal/ceramic joint. Joined to the flanges 12a,b by a material joint (soldered, welded or the like) are a first and second lid 11a and 11b which are also annular and are composed of a metal sheet. On the anode side, the second lid 11b is joined at its inner edge to the anode contact 5 and, together with the anode contact, forms on this side of the housing a hermetic (gastight), vertically slightly deflectable housing termination. The anode-side configuration consequently corresponds to the known "press pack" housing.

On the cathode side, on the other hand, the configuration differs from the conventional housing: at its outer edge, the first lid 11a is indeed likewise joined to the associated first flange 12a by a material joint. Its inner edge does not, however, extend to the cathode contact 4 but terminates at an insulating ring 9, which is preferably composed of a ceramic and is concentrically disposed between cathode contact 4 and first flange 11a. The insulating ring 9 itself is then joined to the cathode contact 4 by a further joining ring 17 made of sheet metal. Cathode contact 4, joining ring 17, insulating ring 9, first lid 11a and first flange 12a thus form the hermetic termination of the housing on the cathode side.

The insulating ring 9 insulates the first lid 11a electrically from the cathode contact 4. This provides the possibility of using the first lid 11a as gate connection G. For this purpose, the semiconductor substrate 2 is designed in such a way that the access to the gate can be made by an annular gate contact 7, which concentrically surrounds the cathode contact 4 or the first Mo disk 3a. The gate contact 7 is connected in an electrically conducting manner to the first lid 11a via a likewise annular gate lead 8. The gate lead 8 is preferably made of sheet metal and is designed so that it runs upwards parallel to, and as close as possible to, the cathode contact 4 and is firmly joined at that point (for example by a cold weld) to the inside of the first lid 11a. Since the gate contact 7 is preferably a pressure contact, the gate lead 8 is of resilient design in order to generate the necessary contact pressure for the gate contact 7. The representation in FIG. 1 clearly shows that this type of low-inductance lead geometry is virtually not manifested outwardly (with the exception that the first lid 11a is no longer at the same potential as the cathode contact 4 but forms an independent gate connection G), with the result that the housing geometry and dimensions can be retained virtually unaltered.

Figure 2:
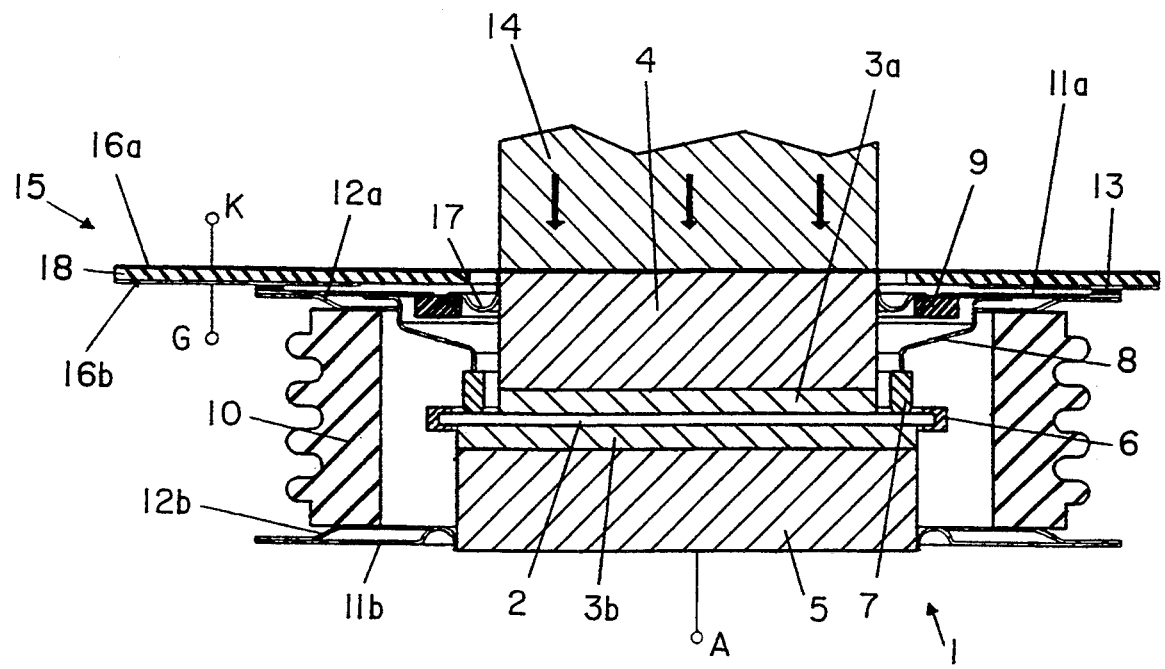
FIG. 2 shows the component shown in FIG. 1 with a supply conductor of the gate-cathode circuit in the form of a strip conductor.

If the edge of the housing, ie. in particular the first lid 11a, is now designed in a further development of the invention in such a way that soldering becomes possible, the component can be connected on the cathode side directly to an extremely low-inductance strip conductor 15 (FIG. 2). Such a strip conductor 15 comprises a sufficiently thick insulating sheet 18, in particular of a polyimide, which is provided on both sides with a metallization 16a or 16b, preferably of Cu. The strip conductor 15 covers the entire surface of the cathode side of the component 1 and consequently also finishes up between the cathode contact 4 and the cathode ram 14 which presses on the cathode contact 4 (in the arrow direction). In order to avoid difficulties with the insulating sheet 18 in the region of the cathode contact 4, the insulating sheet and the second metallization 16b are removed in this region. In this way, only the first (upper) metallization 16a is situated between cathode contact 4 and cathode ram 14 and is used as cathode connection K. The second (lower) metallization 16b is connected in an electrically conducting manner to the first lid 11a by means of a solder joint and is used as gate connection G.

Both measures, the redesign of the gate lead 8 situated in the housing and the use of a strip conductor, make possible an extremely low-inductance connection between the component 1 and the associated gate unit, with the result that a "hard" drive can now be achieved with a substantially lower circuit complexity.

Figure 3:
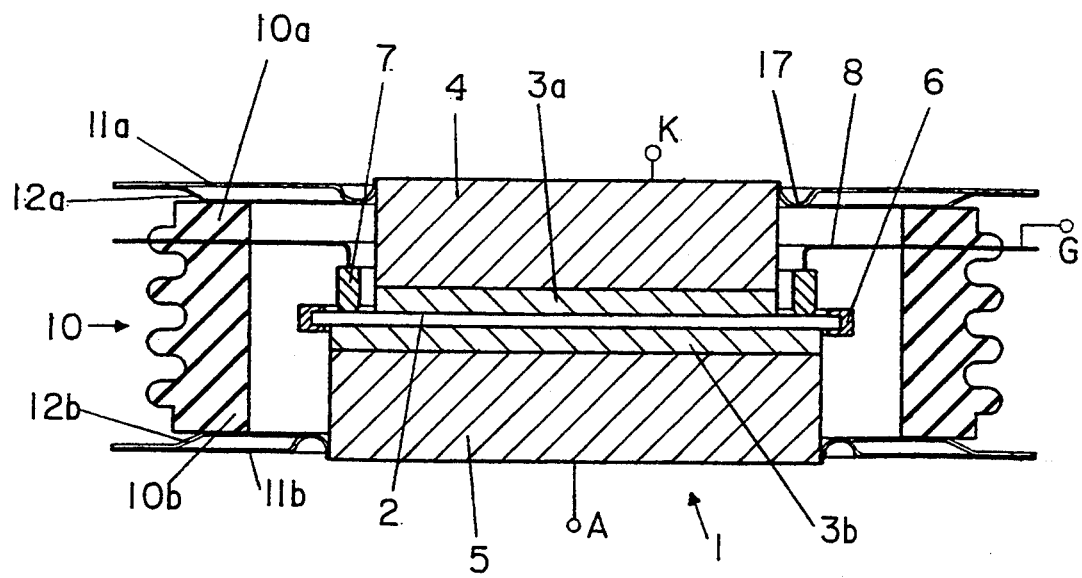
FIG. 3 shows, in section, a second preferred exemplary embodiment for a component in accordance with the invention, comprising annular gate contact and an annular gate lead brought out laterally through the insulating housing.

A second preferred exemplary embodiment is shown in FIG. 3. The structure is similar to the component of FIG. 1, with the difference that the conventional "press pack" housing can now be adopted with still fewer changes. The gate contact 7 is also of annular design in this case and concentrically surrounds the cathode contact 4. The annular gate lead 8 is now not brought out of the component 1 between insulating housing 10 and cathode contact 4, but laterally through the insulating housing 10. For this purpose, the insulating housing 10 is subdivided into an upper and lower (annular) housing section 10a and 10b respectively, between which the gate lead 8 finishes up. The necessary hermetic joint between gate lead 8 and housing parts 10a,b can be achieved, for example, by a direct metal/ceramic joint or by the use of flanges on both sides, like the flanges 12a and 12b. The gate connection G can then be made laterally (as in the conventional component).

Figure 4:
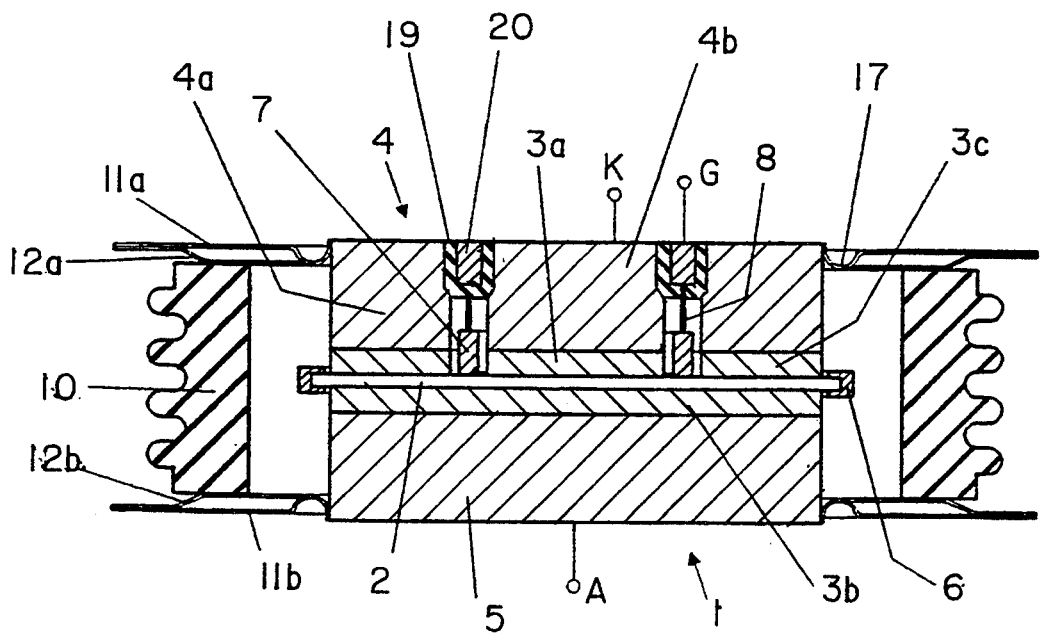
FIG. 4 shows, in section, a third preferred exemplary embodiment for a component in accordance with the invention, comprising an annular gate contact and an annular gate lead brought out upwards through the cathode contact.

A third preferred exemplary embodiment is shown in FIG. 4. In this case, the gate contact 7 is also of annular design, but with a reduced diameter compared with FIGS. 1 and 3. As a result of this type of gate contact, known per se, the gate current can be fed more uniformly to the elementary thyristors distributed over the entire semiconductor substrate 2. The gate contact 7 is electrically accessible through the cathode contact 4 from the cathode side by means of the annular gate lead 8 situated on top of the gate contact 7 and a connecting ring 20 adjacent thereto. The annular structure comprising gate contact 7, gate lead 8 and connecting ring 20 is accommodated in an insulated manner in an annular gap in the cathode contact 4. Said annular gap is due to the fact that not only is the upper Mo interlayer is made up of an inner Mo disk 3a and a concentric outer Mo ring 3c, but also the cathode contact 4 is made up of an inner contact disk 4b and an outer, concentric contact ring 4a. For the purpose of mechanical location, the connecting ring 20 is embedded in an insulating material 19 which fills at least the upper part of the annular gap and which may be composed, for example, of glass or a polymer.

Figure 5:
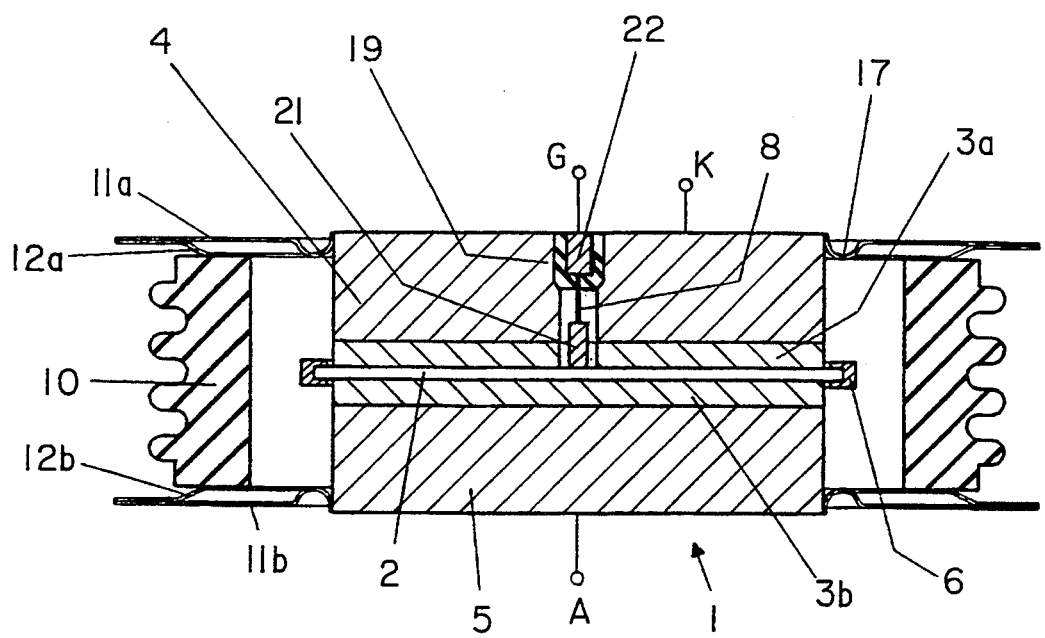
FIG. 5 shows, in section, a fourth preferred exemplary embodiment for a component in accordance with the invention, comprising a central gate contact and a central gate lead brought out upwards through the cathode contact.

Finally, a fourth preferred exemplary embodiment is shown in FIG. 5. In this case, a central gate contact 21, which is connected via a central gate lead 8 to a central connection 22 likewise embedded in insulating material 19, is disposed in a passage hole which runs outwards in the axial direction through the upper Mo disk 3a and the cathode contact 4. As in all the other exemplary embodiments, the gate lead 8 can be of resilient design in this case in order to generate a contact pressure for the gate contact.

In the exemplary embodiment of FIG. 5, however, it has to be borne in mind that the high gate peak current has in this case to be distributed from the inside outwards through small conductor cross sections and that, to connect the gate, a strip conductor 15 with the second metallization 16b has to be run right into the central region of the cathode contact 4, with the danger of a poor heat transfer and a pressing-out of the insulating sheet 18 on exposure to pressure.

All in all, the invention results in a turn-off high-power semiconductor component which can be driven in a "hard" mode in a particularly simple way as a result of a low-inductance design in the interior and, optionally, of a low-inductance lead.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A turn-off high-power semiconductor component in the form of a GTO, comprising:

a disk-shaped semiconductor substrate which is disposed concentrically in an annular insulating housing between a disk-shaped cathode contact on a cathode-contact side, to which pressure can be applied, and a disk-shaped anode contact on an anode-contact side, to which pressure can also be applied, and which is contacted on the cathode-contact side by a gate contact, the cathode and anode contacts being connected to the insulating housing via a first lid and second lid respectively, an outwardly hermetically sealed component being formed, and the gate contact being capable of being fed with a gate current via a gate lead brought to the outside, wherein (a) the gate contact and the gate lead are of annular design, the gate lead being brought out of the component between the cathode contact and the insulating housing, the gate lead being electrically insulated from the cathode contact by a single insulator;

(b) the gate contact surrounds the cathode contact concentrically at a distance;

(c) the gate lead connects the gate contact directly to the first lid; and (d) the first lid is electrically insulated form the cathode contact by an interposed insulating ring which concentrically surrounds the cathode contact.

2. The component as claimed in claim 1, wherein the insulating ring is composed of a ceramic.

3. The component as claimed in claim 1, wherein the insulating ring and the cathode contact are joined together by a metallic joining ring.

4. The component as claimed in claim 1, wherein the two lids and the gate lead are composed of a metal sheet and the gate lead is joined to the first lid by means of a cold weld.

5. The component as claimed in claim 1, wherein (a) to provide a gate connection and a cathode connection, a strip conductor is provided which comprises an insulating sheet having two sides, each of said two sides provided with a metallization, each of the metallizations comprising a coating of an electrically conducting material, a first of said metallizations facing a same direction as said cathode-contact side faces and a second of said metallizations facing a same direction as said anode-contact side faces;

(b) the first metallization of the strip conductor spans the component on the cathode-contact side;

(c) the insulating sheet and the second metallization ending before the cathode contact in such a way that the first metallization is in direct contact with the cathode contact and forms the cathode connection; and (d) the second metallization is electrically connected directly to the first lid and forms the gate connection.

6. The component as claimed in claim 5, wherein the insulating sheet of the strip conductor is composed of a polyimide and the two metallizations are composed of Cu, and wherein the second metallization is soldered to the first lid.

7. The component as claimed in claim 1, wherein the insulating housing is subdivided into an upper housing part and a lower housing part and the gate lead is brought out of the component between the upper and lower housing part.

8. The component as claimed in claim 1, wherein
(a) the gate contact is designed as a central gate contact; and
(b) the gate lead is brought out of the component through the cathode contact in the center and parallel to an axis of the cathode contact.

9. A turn-off high-power semiconductor component in the form of a GTO, comprising:

a disk-shaped semiconductor substrate which is disposed concentrically in an annular insulating housing between a disk-shaped cathode contact on a cathode-contact side, to which pressure can be applied, and a disk-shaped anode contact on an anode-contact side, to which pressure can also be applied, and which is contacted on the cathode-contact side by a gate contact, the cathode and anode contacts being connected to the insulating housing via a first lid and second lid respectively, an outwardly hermetically sealed component being formed, and the gate contact being capable of being fed with a gate current via a gate lead brought to the outside, wherein (a) the gate contact and the gate lead are of annular design, the gate lead being brought out of the component and being electrically insulated from the cathode contact by a single insulator;

(b) the cathode contact is subdivided into an inner contact disk and an outer contact ring which surrounds the inner contact disk concentrically at a distance;

(c) the gate contact is disposed between the inner contact disk and the outer contact ring, the gate contact being isolated from the inner contact disk and the outer contact ring; and (d) the ate lead is brought out of the component between the inner contact disk and the outer contact ring, the gate lead being isolated from the inner contact disk and the outer contact ring by an insulating material.

10. The component as claimed in claim 9, wherein the gate lead terminates on the cathode side in a connecting ring which is embedded in an insulated manner by means of an insulating material between the inner contact disk and the outer contact ring.

11. The component as claimed in any one of claims 2–7 or 10, 8, 1 or 9, wherein the gate contact is a pressure contact and the gate lead is resilient.

* * * * *